(12) United States Patent
Thorp et al.

(10) Patent No.: US 6,618,845 B2
(45) Date of Patent: Sep. 9, 2003

(54) VERIFYING ON-CHIP DECOUPLING CAPACITANCE

(75) Inventors: Tyler J. Thorp, Sunnyvale, CA (US); Pradeep R. Trivedi, Sunnyvale, CA (US); Dean Liu, Sunnyvale, CA (US)

(73) Assignee: Sun Microsystems, Inc., Palo Alto, CA (US)

( * ) Notice: Subject to any disclaimer, the term of this patent is extended or adjusted under 35 U.S.C. 154(b) by 0 days.

(21) Appl. No.: 09/932,191

(22) Filed: Aug. 17, 2001

(65) Prior Publication Data

US 2003/0034783 A1 Feb. 20, 2003

(51) Int. Cl.[7] .......................... G06F 17/50; G01R 31/12
(52) U.S. Cl. ............................... 716/5; 324/548
(58) Field of Search .................... 321/519, 548, 321/686; 716/5, 10, 11, 4; 703/14

(56) References Cited

U.S. PATENT DOCUMENTS

| 6,175,949 B1 | * | 1/2001 | Gristede et al. ........ 716/11 |
| 2003/0034783 A1 | * | 2/2003 | Thorp et al. ........ 324/519 |

* cited by examiner

Primary Examiner—John E. Chapman
Assistant Examiner—James C. Kerveros
(74) Attorney, Agent, or Firm—Rosenthal&Osha L.L.P.

(57) ABSTRACT

A method for verifying on-chip decoupling capacitance by formulating and solving a linear problem. Further, a software tool for determining decoupling capacitance on a computer chip using a linear problem. Further, a method for designing an integrated circuit such that there is enough decoupling capacitance on the integrated circuit.

12 Claims, 3 Drawing Sheets

\* this flow process may be repeated for additional drivers

* this flow process may be repeated for additional drivers

VERIFYING ON-CHIP DECOUPLING CAPACITANCE

BACKGROUND OF INVENTION

As the frequencies of modem computers continue to increase, power consumption by such computers increases accordingly. Because power consumption needs of various components, e.g., microprocessors, within a computer system have to be met in order to sustain the increasing speeds of modem computers, the providing of power to the components within the computer system has to be accurate and predictable.

A power supply for a computer system component, such as a computer chip, typically resides at some distance from discrete elements on the chip. Therefore, a discrete element, such as a driver (transistor), may not get power (via current) as soon as it needs it. In order to combat this potential performance inhibition, one or more decoupling capacitors are positioned across a driver to store charge from the power supply for distribution, when needed, to one or more drivers. The power supply, along with the drivers and decoupling capacitors, form a power grid on the computer chip. Thus, in essence, groups of discrete elements on the chip may have their own power supplies.

It follows that an important concern for designers is to ensure that each driver has enough decoupling capacitance. Referring to FIG. 1a, to verify that there is enough decoupling capacitance on a computer chip (10), a designer selects one of several areas (11), i.e., blocks, on the computer chip (10), chooses a particular signal in that area, and verifies that there is enough decoupling capacitance for the drivers associated with that particular signal. However, this verification process does not guarantee that there is enough decoupling capacitance within a given distance of a particular driver.

Such a guarantee is important because driver delay depends on how quickly charge, i.e., power, is transferred from a power supply or decoupling capacitor to a particular driver. Typically, charge transfer from a power supply is slower than charge transfer from a decoupling capacitor, and thus, it is imperative that there be enough decoupling capacitance for the particular driver. The faster a driver gets power, the faster a signal driven by the driver can switch.

FIG. 1b shows an expansion (12) of one of the areas (11) on the computer chip (10). The expanded area (12) has decoupling capacitors (14) and drivers (16). Further, power supply lines (14) provide power to the decoupling capacitors (14) and drivers (16). In turn, the drivers (16) drive groups of discrete elements (not shown) on the computer chip (10) by providing signals to them as needed. The decoupling capacitors (14) store charge from the power supply lines (14) for distribution, when needed, to the drivers (16).

Typically, a designer selects a signal (not shown) residing in the area (12), and determines whether there are enough decoupling capacitors (14), i.e., enough decoupling capacitance, for the drivers (16) associated with the selected signal in the selected area (12). In other words, the designer compares the ratio between the total number of decoupling capacitors and drivers in the selected area (12).

The ability of a decoupling capacitor to adequately distribute charge to a particular driver depends on the distance between the decoupling capacitor and the particular driver. Thus, in order for a decoupling capacitor to distribute charge to a driver that resides relatively far away from the decoupling capacitor, the decoupling capacitor has to be large enough to be able to sufficiently distribute charge to the driver. It follows that the area used by a decoupling capacitor is proportional to a particular driver. This relationship results in a need for a balance between providing adequate charge to ensure proper driver performance and meeting area restrictions on a computer chip.

SUMMARY OF INVENTION

According to one aspect of the present invention, a method for determining decoupling capacitance on a computer chip comprises selecting a driver on the computer chip, selecting a first decoupling capacitor, where the first decoupling capacitor is within a specified distance of the driver, forming a linear equation based on the driver and the first decoupling capacitor, wherein a linear problem comprises the linear equation, and solving the linear problem to determine decoupling capacitance on the computer chip.

According to another aspect, a software tool that determines decoupling capacitance on a computer chip having a driver and at least one decoupling capacitor comprises a first portion that selects a driver, a second portion that selects a first decoupling capacitor, where the first decoupling capacitor is within a specified distance of the driver, a third portion that forms a linear equation based on the driver and the first decoupling capacitor, where a linear problem comprises the linear equation, and a last portion that solves the linear problem to verify decoupling capacitance on the computer chip.

According to another aspect, a method for designing an integrated circuit, comprises determining a decoupling capacitance need of the integrated circuit, verifying an amount of decoupling capacitance on the integrated circuit, where verifying the amount of decoupling capacitance comprises forming and solving a linear problem, and resizing at least one decoupling capacitor based on a solution of the linear problem.

Other aspects and advantages of the invention will be apparent from the following description and the appended claims.

DETAILED DESCRIPTION

The present invention relates to a method for verifying an amount of on-chip decoupling capacitance given a distance between a driver and a decoupling capacitor and an amount of decoupling capacitance needed for charge distribution. The present invention further relates to a method for forming a linear problem, where the solution to the linear problem is used to verify an amount of on-chip decoupling capacitance. The present invention also relates to a software tool that verifies an amount of decoupling capacitance on all or part of a computer chip.

Figure 1A:
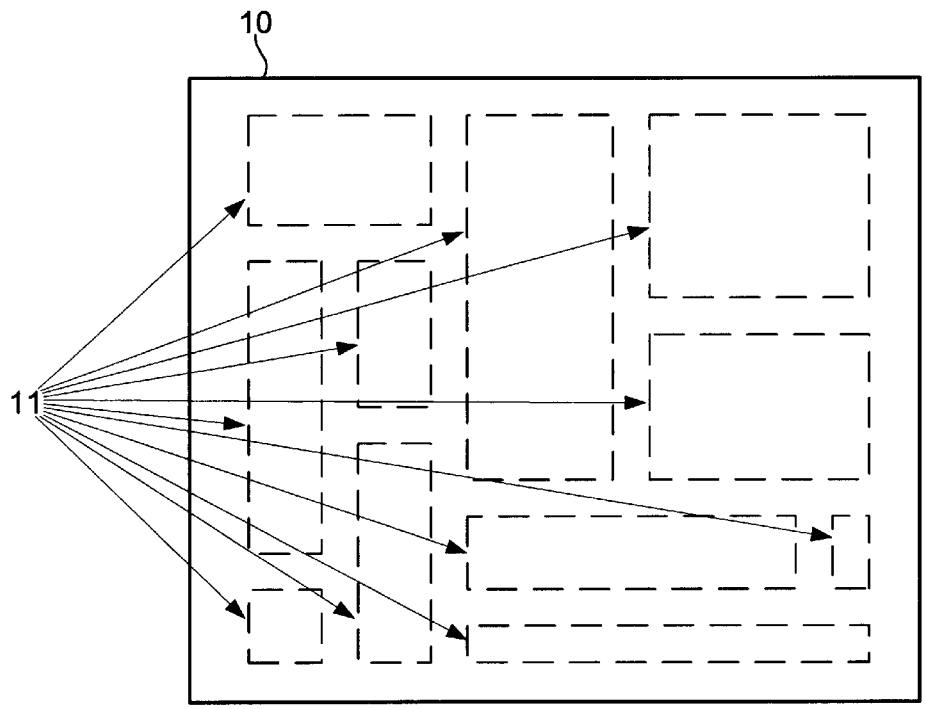
FIG. 1a shows a typical computer chip.
Figure 1B:
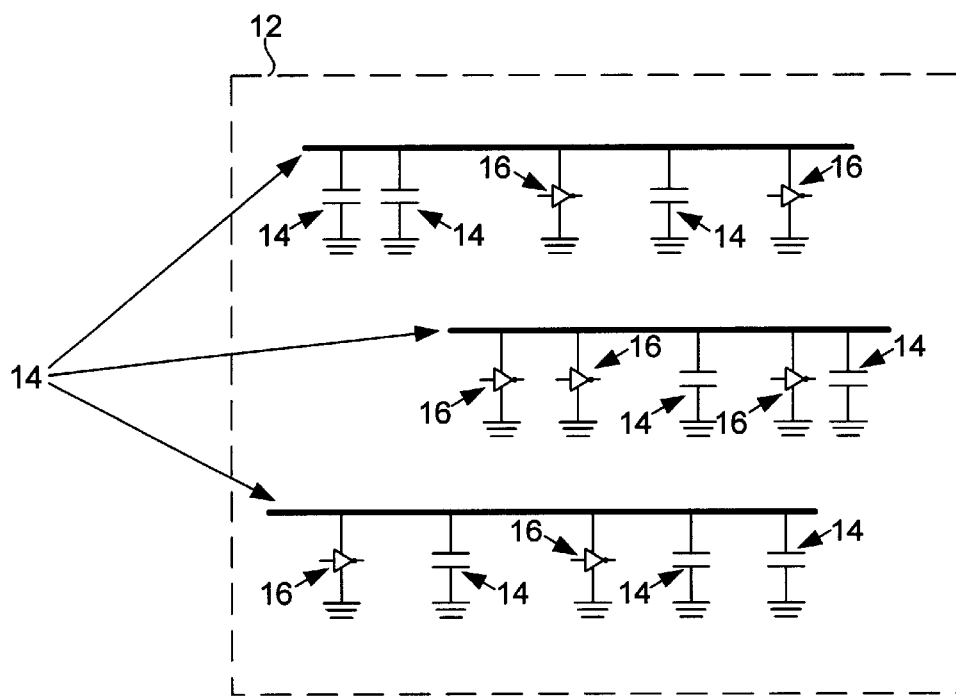
FIG. 1b shows a selected area of a computer chip.
Figure 2:
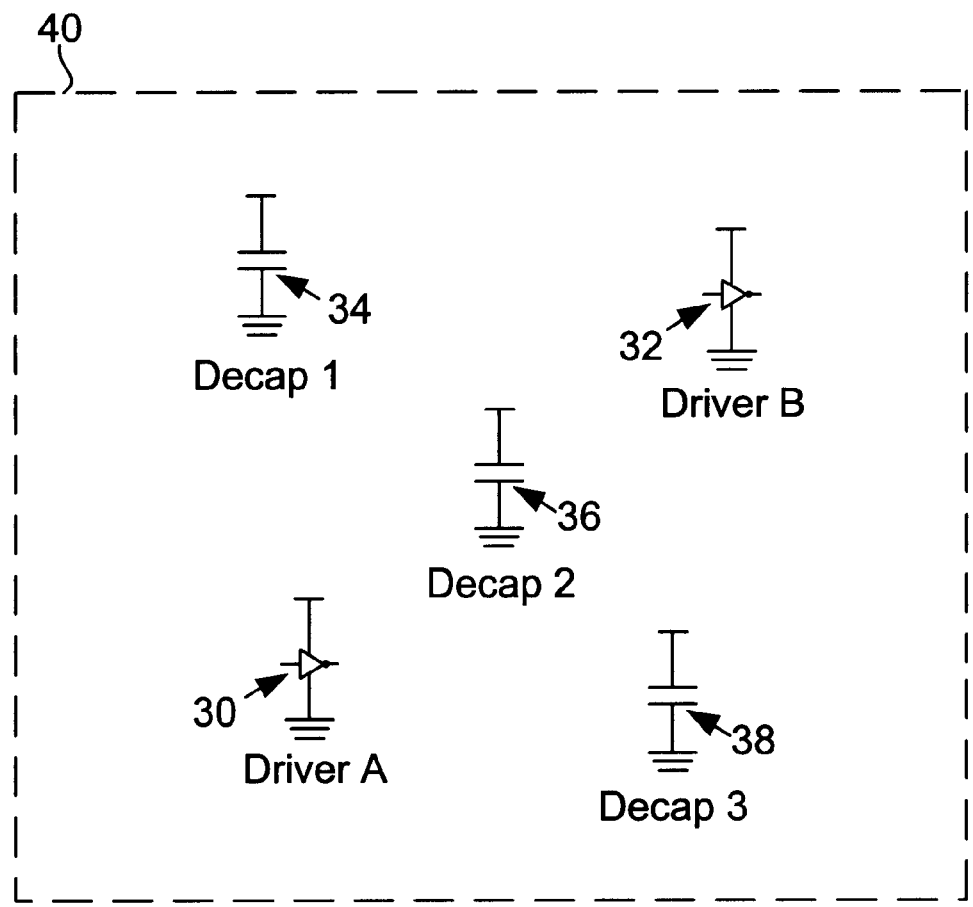
FIG. 2 shows an arrangement of drivers and decoupling capacitors in accordance with an embodiment of the present invention.

FIG. 2 shows an exemplary arrangement of drivers (30, 32) and decoupling capacitors (34, 36, 38) on a computer chip (40) in accordance with an embodiment of the present invention. Driver A (30) and Driver B (32) are used to drive discrete elements (not shown) on the computer chip (40).

Decoupling Capacitors 1, 2, and 3 (referred to and shown as "Decap 1," "Decap 2," and "Decap 3," respectively) (34, 36, 38) are used to provide on-chip decoupling capacitance. A percentage of a decoupling capacitor used by a particular driver is indicated as $D_{XY}$, where X represents the particular driver and Y represents the particular decoupling capacitor. For example, $D_{B2}$ indicates the percentage of Decap 2 (36) used by Driver B (32).

In order to verify that the amount of decoupling capacitance on the computer chip (40) is adequate to sufficiently distribute charge that may be required by each of the drivers (32, 34), the present invention provides a method by which to form a linear problem, where the solution to the linear problem indicates whether there is enough decoupling capacitance on the computer chip (40) for the drivers on the computer chip (40).

Figure 3:
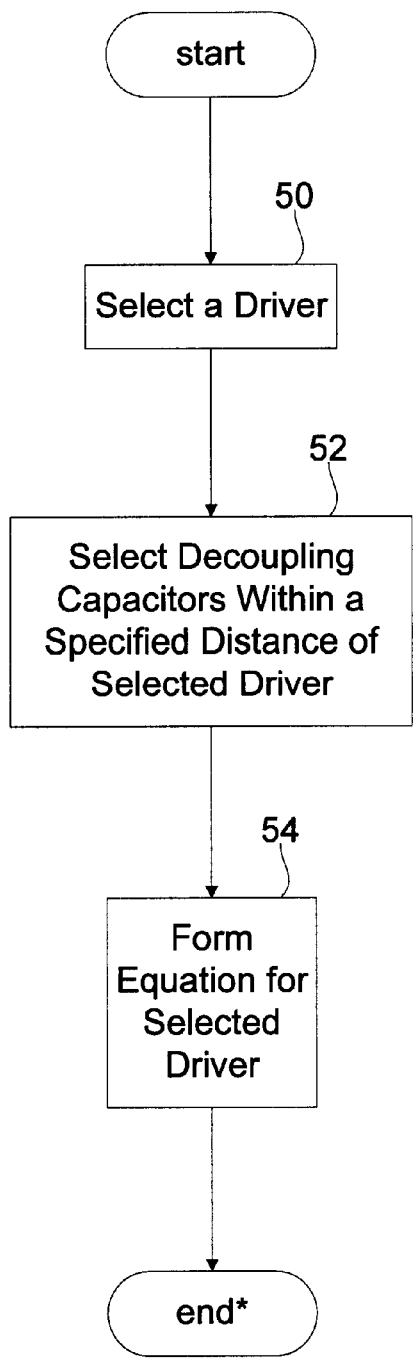
FIG. 3 shows a flow process for forming a linear problem in accordance with an embodiment of the present invention.

FIG. 3 shows an exemplary flow process for generating a linear problem from an arrangement of drivers and decoupling capacitors on a computer chip in accordance with the embodiment shown in FIG. 2. First, a driver on the computer chip is selected (step 50). Decoupling capacitors within a specified distance of the selected driver are then selected (step 52).

Next, the decoupling capacitance need of the selected driver is equated to the summation of the products of the capacitances of each of the selected decoupling capacitors and the use percentages of the selected decoupling capacitors by the selected driver (step 54). Those skilled in the art will appreciate that this step may be repeated for remaining drivers on the computer chip. Further, those skilled in the art will appreciate that the equations that are formed for the selected drivers form a linear problem that can be solved to verify decoupling capacitance on the computer chip.

However, before the linear problem is solved, certain conditions must be met in order to ensure verification requirements. For example, a decoupling capacitor that is used by multiple drivers cannot be fully used by each of the multiple drivers. Thus, conditions are applied requiring that the cumulative percentage use of the decoupling capacitor by one or more drivers does not exceed 1. In other words, only 100% of a decoupling capacitor can be used, and this condition must be accounted for in the equations which are formed for the linear problem.

Under the constraints of these conditions, the linear problem can be solved, whereafter the decoupling capacitances of the drivers on a computer chip can be determined. Based on the decoupling capacitance needs of the drivers, a determination can be made as to whether enough decoupling capacitance is present to decrease driver delays relative to when there is not enough decoupling capacitance present. Further, those skilled in the art will appreciate that the verification of on-chip decoupling capacitance by solving the linear problem may indicate whether chip area is being wasted in cases where there is too much decoupling capacitance.

Equations (1)–(5) (an individual equation is referred to as "linear equation") show the generation of a linear problem based on the arrangement of drivers and decoupling capacitors shown in FIG. 2.

Driver A decoupling capacitance=Decap $1*D_{A1}$+Decap $2*D_{A2}$+ Decap $3*D_{A3}$ (1)

Driver B decoupling capacitance=Decap $1*D_{B1}$+Decap $2*D_{B2}$ (2)

$D_{A1}+D_{B1}<1$ (3)

$D_{A2}+D_{B2}<1$ (4)

$D_{A3}<1$ (5)

Equation (1) equates the decoupling capacitance need of Driver A (30) to the sum of the products of those decoupling capacitors (34, 36, 38) that are within a specified distance of Driver A (30) and the use percentages of those decoupling capacitors (34, 36, 38) by Driver A (30). Equation (2) equates the decoupling capacitance need of Driver B (32) to the sum of the products of those decoupling capacitors (34, 36) that are within a specified distance of Driver B (32) and the use percentages of those decoupling capacitors (34, 36) by Driver B (32). For Driver B (32) in Equation (2), note that Decap 3 (38) is not included because it resides outside a specified distance of Driver B (32).

Equations (3)–(5) are the conditions that are placed on the percentage use parameters in Equations (1)–(2). Equations (3)–(5) indicate that no more than 100% of each decoupling capacitor can be used by those drivers that fall within the specified distance. Note that once a capacitor falls outside some distance from a driver, the capacitive effects of the capacitor on the driver are considered so minimal that its capacitance is considered as not being used by the driver.

Equations (1)–(5), which form the linear problem for the exemplary arrangement of drivers and decoupling capacitors shown in FIG. 2, are solved to determine the amount of decoupling capacitance for each driver. If one or more drivers are not meeting specified decoupling capacitance needs, then there is not enough decoupling capacitance on the computer chip and changes such as the repositioning, addition, or resizing of elements may be made. In the case that one or more drivers are overcompensated with respect to the amount of decoupling capacitance they are receiving, then there is probably too much decoupling capacitance on the computer chip and changes such as the repositioning, removal, or resizing of elements may be made.

In another embodiment of the present invention, because a linear problem can be formulated for verifying decoupling capacitance, a software tool may be used to solve the linear problem. The software tool may include linear programming tools to solve the linear problem. This is advantageous because actual on-chip measurements do not have to be made to verify decoupling capacitance.

Advantages of the following invention may include one or more of the following. In some embodiments, because on-chip decoupling capacitance is verified, driver delay is decreased relative to when there is not enough on-chip decoupling capacitance, which, in turn, in turn leads to faster switching times and increased frequency operation.

In some embodiments, because on-chip decoupling capacitance is verified, unnecessary charge transfer from a power supply may be avoided. Further, this results in the reduction of noise on the power supply.

In some embodiments, because a method for verifying on-chip decoupling capacitance may consider all the drivers and decoupling capacitors on a computer chip, unnecessary and over compensatory measurements may be avoided.

In some embodiments, because a linear problem is formed to verify on-chip decoupling capacitance, a software tool may be used for solving the linear problem.

In some embodiments, because a linear problem is formed to verify on-chip decoupling capacitance, where the linear problem accounts for decoupling capacitance of a driver on a computer chip, chip elements can be tested for proper functionality.

While the invention has been described with respect to a limited number of embodiments, those skilled in the art, having benefit of this disclosure, will appreciate that other embodiments can be devised which do not depart from the scope of the invention as disclosed herein. Accordingly, the scope of the invention should be limited only by the attached claims.

What is claimed is:

1. A method for determining decoupling capacitance on a computer chip, comprising:
   selecting a drive on the computer chip;
   selecting a first decoupling capacitor, wherein the first decoupling capacitor is within a specified distance of the driver;
   forming a linear equation based on the driver and the first decoupling capacitor, wherein a linear problem comprises the linear equation;
   setting a condition on the linear problem such that the linear problem does not allocate more than 100% use of the first decoupling capacitor; and
   solving the linear problem to determine decoupling capacitance on computer chip.

2. The method o claim 1, wherein forming the linear equation comprises:
   forming a first term by multiplying a capacitance of the first decoupling capacitor with a value of percentage use of the first decoupling capacitor by the driver; and
   equating a decoupling capacitance need of the driver with the first term.

3. The method of claim 2, wherein forming the linear equation further comprises:
   selecting a second decoupling capacitor, wherein the second decoupling capacitor is within the specified distance of the driver;
   forming a second term by multiplying a capacitance of the second decoupling capacitor with a value of percentage use of the second decoupling capacitor by the driver; and
   equating the decoupling capacitance need of the driver with a sum of the first term and the second term.

4. A software tool that determines decoupling capacitance on a computer chip having a driver and at least one decoupling capacitor, comprising:
   a first portion that selects a driver;
   a second portion that selects a first decoupling capacitor, wherein the first decoupling capacitor is within a specified distance of the driver;
   a third portion that forms a linear equation based on the driver and the first decoupling capacitor, wherein the third portion forms a first term that results from the multiplication of a capacitance of the first decoupling capacitor and a value of percentage use of the first decoupling capacitor by the driver, and wherein a decoupling capacitance need of the driver is equated to the first term, wherein
   a linear problem comprises the linear equation; and
   a last portion that solves the linear problem to verify decoupling capacitance on the computer chip.

5. The software claim 4, wherein the second portion selects a second decoupling capacitor, wherein the second decoupling capacitor is within the specified distance of the driver, wherein the third portion forms a second term that results from the multiplication of a capacitance of the second decoupling capacitor and a value of percentage use of the second decoupling capacitor by the driver, and wherein the decoupling capacitance need of the driver is equated to a sum of the first term an the second term.

6. The software of claim 4, wherein a condition on the linear problem is provided such that the linear problem does not allocate more than 100% use of a decoupling capacitor.

7. The software tool of claim 4, wherein the software tool is a linear programming tool.

8. A method for designing an integrated circuit, comprising:
   determining a decoupling capacitance need of the integrated circuit;
   verifying an amount of decoupling capacitance on the integrated circuit, wherein verifying the amount of decoupling capacitance comprises forming and solving a linear problem; and
   resizing at least one decoupling capacitor based on a solution of the linear problem, wherein resizing of the at least one decoupling capacitor depend on whether the decoupling capacitance need of the driver is met.

9. The method of claim 8, wherein verifying the amount of decoupling capacitance comprises:
   selecting a driver on the integrated circuit;
   selecting a first decoupling capacitor, wherein the first decoupling capacitor is within a specified distance of the driver;
   forming a linear equation based on the driver and the first decoupling capacitor, wherein a linear problem comprises the linear equation; and
   solving the linear problem to determine decoupling capacitance on the integrated circuit.

10. The method of claim 9, wherein forming the linear equation comprises:
    forming a first term by multiplying a capacitance of the first decoupling capacitor with a value of percentage use of the first decoupling capacitor by the driver; and
    equating a decoupling capacitance need of the driver with the first term.

11. The method of claim 10, wherein forming the linear equation further comprises:
    selecting a second decoupling capacitor, wherein the second decoupling capacitor is within the specified distance of the driver;
    forming a second term by multiplying a capacitance of the second decoupling capacitor with a value of percentage use of the second decoupling capacitor by the driver; and
    equating the decoupling capacitance need of the driver with a sum of the first term and the second term.

12. The method of claim 8, further comprising:
    setting a condition on the linear problem such that the linear problem does not allocate more than 100% use of the at least one decoupling capacitor.

* * * * *

UNITED STATES PATENT AND TRADEMARK OFFICE
CERTIFICATE OF CORRECTION

PATENT NO.   : 6,618,845 B2
DATED        : September 9, 2003
INVENTOR(S)  : Tyler J. Thorp et al.

It is certified that error appears in the above-identified patent and that said Letters Patent is hereby corrected as shown below:

Title page,
Item [*] Notice, please replace the current language with -- Subject to any disclaimer, the term of this patent is extended or adjusted under 35 U.S.C. 154(b) by 151 days. --

Signed and Sealed this

Twenty-seventh Day of July, 2004

JON W. DUDAS
*Acting Director of the United States Patent and Trademark Office*

UNITED STATES PATENT AND TRADEMARK OFFICE
CERTIFICATE OF CORRECTION

PATENT NO. : 6,618,845 B2
DATED : September 9, 2003
INVENTOR(S) : Thorp et al.

It is certified that error appears in the above-identified patent and that said Letters Patent is hereby corrected as shown below:

Title page,
Item [*] Notice, delete the phrase "by 0 days" and insert -- by 151 days --

Signed and Sealed this

Twenty-eighth Day of September, 2004

JON W. DUDAS
*Director of the United States Patent and Trademark Office*